(12) United States Patent
Hosokawa et al.

(10) Patent No.: US 6,284,393 B1
(45) Date of Patent: Sep. 4, 2001

(54) ORGANIC ELECTROLUMINESCENT DEVICE

(75) Inventors: Chishio Hosokawa; Masahide Matsuura; Hiroshi Tokailin, all of Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 08/980,345

(22) Filed: Nov. 28, 1997

(30) Foreign Application Priority Data

Nov. 29, 1996 (JP) .................................................. 8-319567
Apr. 18, 1997 (JP) .................................................. 9-101570

(51) Int. Cl.[7] .................................................. H05B 33/26
(52) U.S. Cl. .......................... 428/690; 428/917; 313/504; 313/505; 313/506; 257/91
(58) Field of Search .................................. 428/690, 691, 428/917; 313/504–507; 257/88, 91

(56) References Cited

U.S. PATENT DOCUMENTS

| | | | |
|---|---|---|---|
| 4,885,211 | * 12/1989 | Tang et al. | 428/457 |
| 5,364,654 | * 11/1994 | Hosokawa et al. | 427/66 |
| 5,457,565 | * 10/1995 | Namiki et al. | 359/273 |
| 5,458,986 | * 10/1995 | Wilber et al. | 428/697 |
| 5,635,308 | * 6/1997 | Inoue et al. | 428/690 |
| 5,714,838 | * 2/1998 | Haight et al. | 313/506 |
| 5,776,623 | 7/1998 | Hung et al. | 428/690 |
| 5,969,474 | * 10/1999 | Arai | 313/504 |

OTHER PUBLICATIONS

Derwent Abstracts, AN 98–368350 (JP 10 144475, May 29, 1998). abstract only.

Patent Abstracts of Japan, vol. 096, No. 010, Oct, 31. 1996 (JP 08 151572, Jun. 11, 1996). abstract only.

Patent Abstracts of Japan, vol. 095, No. 001, Feb. 28, 1995 (JP 06 295788, Oct. 21, 1994). abstract only.

Patent Abstracts of Japan, vol. 017, No. 480 (E–1425), Aug. 31, 1993 (JP 05 121172, May 18, 1993). abstract only.

Derwent Abstracts, AN 96–381275 (JP 08 185984, Jul. 16, 1996). abstract only.

* cited by examiner

*Primary Examiner*—Marie Yamnitzky
(74) *Attorney, Agent, or Firm*—Oblon, Spivak, McClelland, Maier & Neustadt, P.C.

(57) ABSTRACT

Transparent, organic EL devices comprising an positive electrode, a negative electrode and an organic layer including an organic light-emitting layer as sandwiched between the two electrodes, in which the negative electrode is comprised of an electron injection electrode layer and an amorphous transparent conductive film, and the electron injection electrode layer is adjacent to the organic layer, or in which the negative electrode is comprised of an electron injection electrode layer, a transparent conductive film and a thin metal film having a specific resistance of not larger than $1 \times 10^{-5}$ $\Omega \cdot cm$, as laminated in that order with the electron injection electrode layer being adjacent to the organic layer, and a thin transparent film is formed outside the negative electrode. Preferably, the transparent conductive film is an amorphous one. The devices have a negative electrode with low resistance and high transparency, and have high luminous efficiency and good durability (wet heat resistance). The light emission can be taken out through the side of the negative electrode of the devices. The devices are usable for high-resolution display.

13 Claims, 6 Drawing Sheets

ORGANIC ELECTROLUMINESCENT DEVICE

FIELD OF THE INVENTION

The present invention relates to an organic electroluminescent (EL) device with excellent durability, in which the light emission can be taken out through its both sides.

BACKGROUND OF THE INVENTION

As being self-luminescent, EL devices have high visibility. In addition, they have high impact resistance as being completely solid devices. Therefore, the use of EL devices in various displays as light emitters is widely noticed.

EL devices are grouped into inorganic EL devices in which are used inorganic compounds as light-emitting materials, and organic EL devices in which are used light-emitting organic compounds. Of those, organic EL devices have been being much studied and expected as light emitters in the next generations, since they can be easily small-sized while requiring a greatly reduced voltage amplitude.

Organic EL devices generally have a basic structure of positive electrode/light-emitting layer/negative electrode, in which a transparent positive electrode is positioned over a substrate such as a glass sheet. In those, the light emission is taken out through the side of the substrate.

For the following reasons (a) to (c), transparent negative electrodes are disclosed as the recent approach in the art. The light is taken out through the side of the negative electrode for the organic devices with the transparent negative electrodes.

(a) In the EL devices of that type, where the positive electrode is also transparent, one can obtain transparent EL devices.

(b) Any desired color can be employed as the background color for the transparent EL devices. Therefore, the EL devices could be colorful even while they do not emit light, and could be decorative ones. Where the background color for the EL devices is black, the contrast for those devices is improved.

(c) A color filter or a color-converting layer, if used, could be disposed over the transparent EL devices. Therefore the EL devices can be fabricated without considering the heat resistance of those filter and layer. For example, one advantage is that when the positive electrode for the EL devices is formed, the substrate temperature can be increased to thereby lower the resistance value of the positive electrode formed.

On the other hand, the recent tendency in the art is toward high-resolution and large-sized displays comprising organic EL devices, and high-resolution display devices require fine pixels of not larger than several hundreds $\mu m^2$ in size. In such high-resolution display devices, the scanning electrode lines and the signal electrode lines shall become very narrow, resulting in that they shall have higher resistance. In those, however, the scanning electrode lines and the signal electrode lines with such high resistance are problematic in that the voltage level in the devices is lowered and that the devices being driven produce delayed responses. Specifically, the voltage drops make the luminance of the devices inhomogeneous, while the delayed responses make it difficult to image moving pictures on the display. For these reasons, the high-resolution display devices with such disadvantages are problematic in that their displays are limited.

In those display devices, the scanning electrode lines and the signal electrode lines are connected with the lower electrodes and the upper electrodes constituting the organic EL devices. Therefore, the positive electrodes and the negative electrodes for those lower electrodes and the upper electrodes are required to have lower resistance values.

Transparent negative electrodes, if used in organic EL devices, have various advantages such as those mentioned hereinabove. Therefore, various approaches are being tried in the art to the production of organic EL devices with transparent negative electrodes.

Japanese Patent Application Laid-Open No. 185984/1996 discloses a transparent EL device, which comprises a first electrode layer of a transparent conductive layer, and a second electrode layer composed of an ultra-thin, electron injection metal layer and a transparent conductive layer formed thereon. However, this does not disclose at all any technical idea of lowering the resistance of those electrode layers. In this, used are ITO (indium tin oxide) and $SnO_2$ as the substances constituting the transparent conductive layers. However, it is impossible to make these substances non-crystalline to such a degree that they give no peak in their X-ray diffraction patterns, and therefore the substances used in the disclosed technique are naturally crystalline ones. Accordingly, where a layer of any of these substances is positioned onto a substrate via an organic layer while the substrate temperature is kept at about room temperature to 100° C. or so in order to prevent the organic layer from being damaged, the transparent conductive layer formed shall have a high specific resistance value. For example, for ITO, its layer shall have a specific resistance of not smaller than $1 \times 10^{-3}$ Ω·cm or so. In the organic EL devices having such a transparent conductive layer with such a high specific resistance, the voltage is lowered at the wired lines of the transparent conductive layer, resulting in that the light emission is inhomogeneous. Therefore, some improvements are desired for lowering the specific resistance of the conductive layer in those EL devices. In addition, since ITO and $SnO_2$ are naturally crystalline substances, water and oxygen easily penetrate thereinto through their grain boundaries. Therefore, the electron injection metal layers to be laminated adjacent to the conductive layers of those substances, ITO and $SnO_2$, are easily deteriorated, thereby producing light emission defects or even failing in light emission. Thus, the transparent EL device disclosed does not have satisfactory durability, and further improvements therein are desired. If the transparent organic EL device of that type, in which the negative electrode is made of only one crystalline, transparent conductive layer, is used in high-resolution display devices, the voltage will be lowered at the wired lines of the transparent conductive layer to thereby make the light emission inhomogeneous. Therefore, the use of the EL device itself is limited. In addition, since ITO and $SnO_2$ are naturally crystalline substances, water and oxygen easily penetrate thereinto through their grain boundaries. Therefore, the electron injection metal layers to be laminated adjacent to the conductive layers of those substances, ITO and $SnO_2$, are easily deteriorated, thereby often producing light emission defects or even failing in light emission. Accordingly, it is desired to further improve the durability of the organic EL device.

For the crystalline transparent conductive layer used in the disclosed technique, it is difficult to employ a so-called taper etching process for forming an etched pattern of the layer having a trapezoidal cross-sectional profile in producing organic EL display devices having an XY matrix structure. Therefore, using the crystalline transparent conductive layer, it is often difficult to produce high-resolution display devices.

SUMMARY OF THE INVENTION

One object of the present invention is to solve the problems in the prior art and to provide an organic EL device having a negative electrode with low resistance and high transparency.

Another object of the invention is to provide an organic EL device with excellent durability, in which water and oxygen hardly penetrate into the transparent conductive layer constituting the negative electrode.

Still another object of the invention is to solve the problems in the prior art and to provide an organic EL device in which the light emission can be taken out even through the side of the negative layer and which can be used in high-resolution display devices.

Still another object of the invention is to provide an organic EL device with excellent durability (wet heat resistance) which can be installed with ease in high-resolution display devices.

In order to attain those objects, we, the present inventors have assiduously studied and, as a result, have found that the objects can be attained by employing an amorphous, transparent conductive film for the negative electrode in an organic EL device. In addition, we have further found that an organic EL device having a negative electrode with low resistance and high transparency can be obtained by disposing a thin metal film with low resistance outside the transparent conductive film constituting the negative electrode. On the basis of these findings, we have completed the present invention.

Specifically, the invention provides the following:

(1) An organic electroluminescent device comprising an positive electrode, a negative electrode and an organic layer including an organic light-emitting layer as sandwiched between the two electrodes, which is characterized in that the negative electrode is comprised of an electron injection electrode layer and an amorphous transparent conductive film, and that the electron injection electrode layer is adjacent to the organic layer.

(2) The organic electroluminescent device of (1), in which the electron injection electrode layer is of an ultra-thin film comprising one or more selected from electron-injecting metals, alloys and alkaline earth metal oxides.

(3) The organic electroluminescent device of (1), in which the electron injection electrode layer is a mixed layer comprising one or more selected from electron-injecting metals, alloys and alkaline earth metal oxides, and an electron-transmitting organic substance.

(4) The organic electroluminescent device of (1), in which the electron injection electrode layer comprises an island-like electron injection zone.

(5) The organic electroluminescent device of any one of (1) to (4), in which the amorphous transparent conductive film is made of an oxide of indium (In), zinc (Zn) and oxygen (O).

(6) An organic electroluminescent device comprising an positive electrode, a negative electrode and an organic layer including an organic light-emitting layer as sandwiched between the two electrodes, which is characterized in that the negative electrode is comprised of an electron injection electrode layer, a transparent conductive film and a thin metal film having a specific resistance of not larger than $1\times10^{-5}$ $\Omega\cdot cm$, as laminated in that order with the electron injection electrode layer being adjacent to the organic layer, and that a thin transparent film is formed outside the negative electrode.

(7) The organic electroluminescent device of (6), in which the transparent conductive film is an amorphous transparent conductive film.

(8) The organic electroluminescent device of (7), in which the amorphous transparent conductive film is made of an oxide of indium (In), zinc (Zn) and oxygen (O).

(9) The organic electroluminescent device of any one of (6) to (8), in which the electron injection electrode layer is of an ultra-thin film comprising one or more selected from electron-injecting metals, alloys and alkaline earth metal oxides.

(10) The organic electroluminescent device of any one of (6) to (8), in which the electron injection electrode layer is a mixed layer comprising one or more selected from electron-injecting metals, alloys and alkaline earth metal oxides, and an electron-transmitting organic substance.

(11) The organic electroluminescent device of any one of (6) to (8), in which the electron injection electrode layer comprises an island-like electron injection zone.

(12) The organic electroluminescent device of (7) or (8), in which the negative electrode and the positive electrode form XY matrices and the transparent conductive film is formed to have a trapezoidal (tapered) cross-sectional profile.

(13) An organic electroluminescent device comprising an positive electrode, a negative electrode and an organic layer including an organic light-emitting layer as sandwiched between the two electrodes, which is characterized in that a thin transparent film is formed outside the negative electrode, that the layer comprised of the negative electrode and the thin transparent film has a light transmittance of not smaller than 60%, and that the layer comprised of the negative electrode and the thin transparent film, or the negative electrode has a sheet resistivity of not larger than 10 $\Omega$/square.

Figure 1:
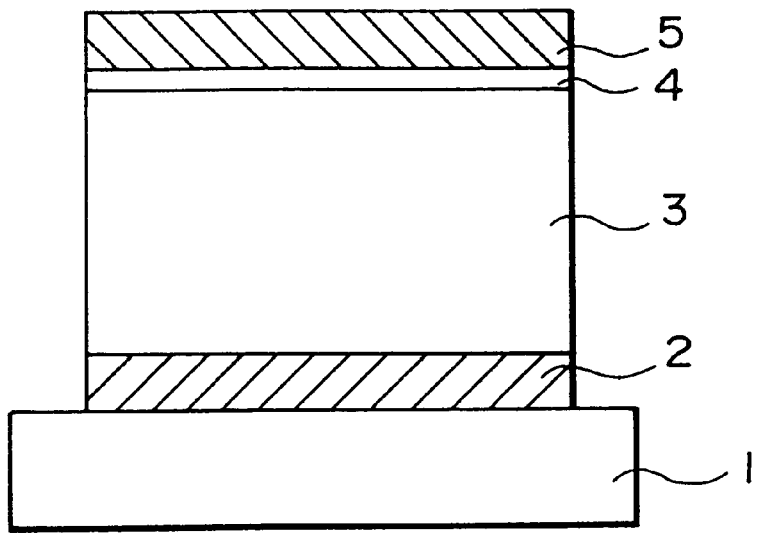
FIG. 1 to FIG. 5 are to illustrate the organic EL device of (1) to (5) of the invention.
Figure 2:
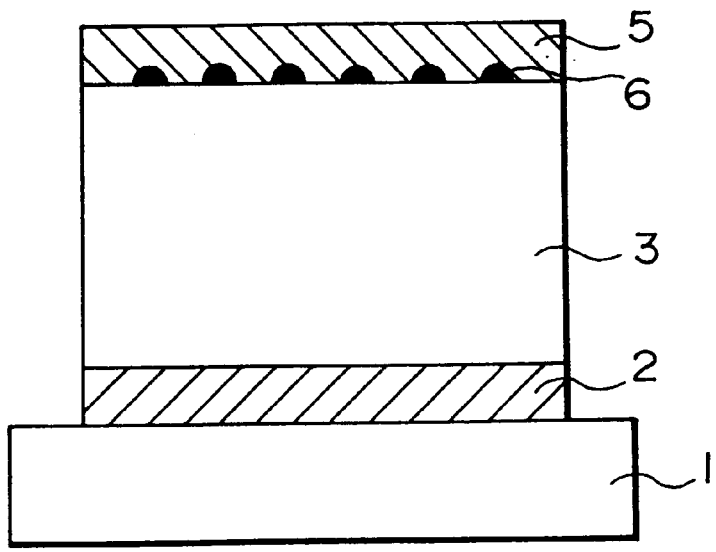
Figure 3:
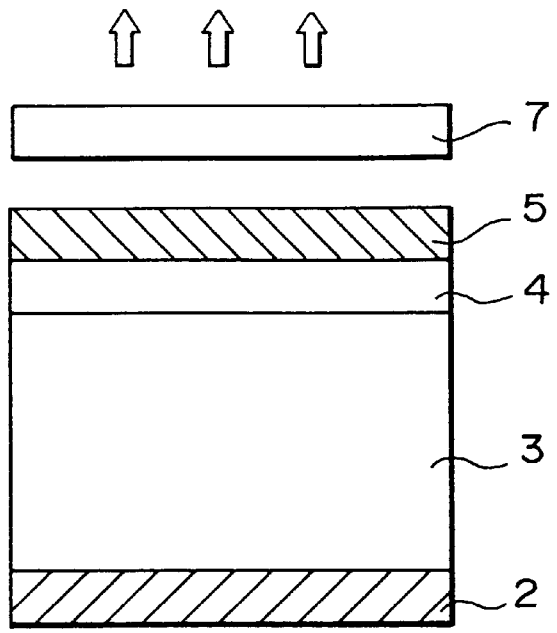
Figure 4:
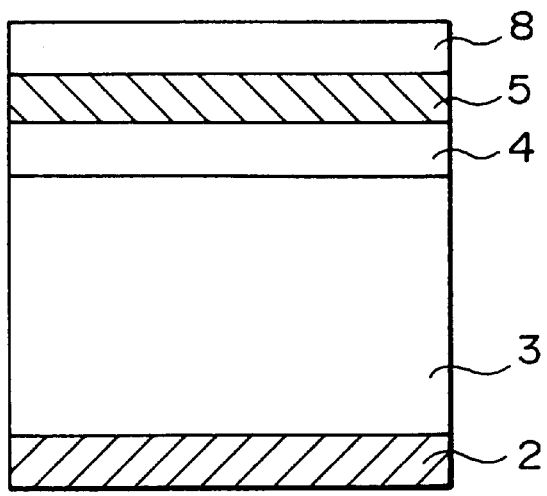
Figure 5:
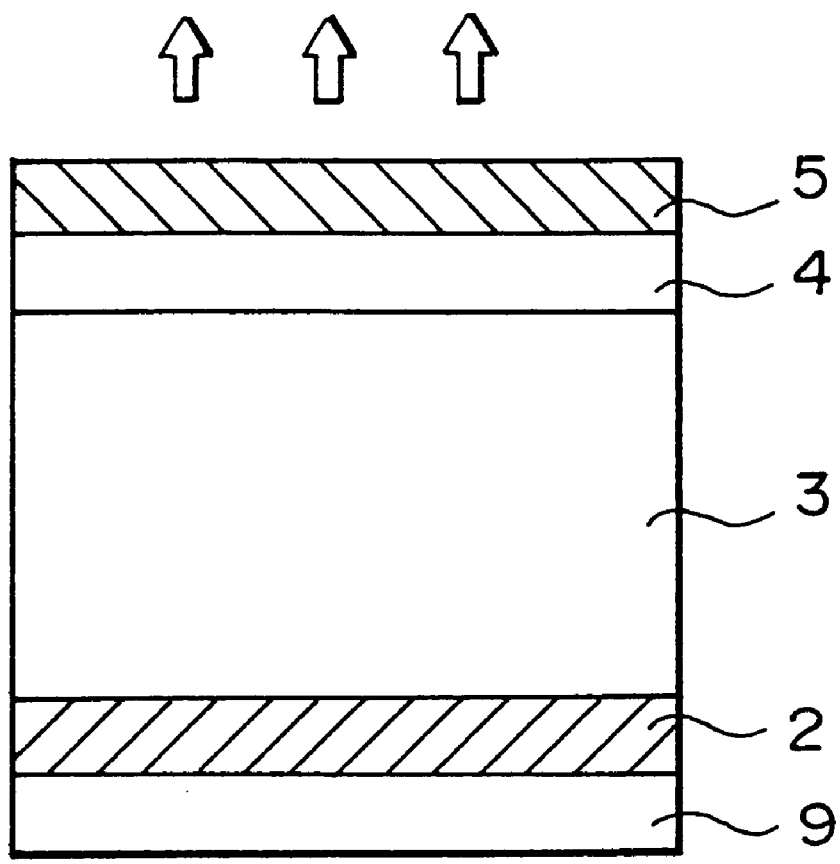
Figure 6:
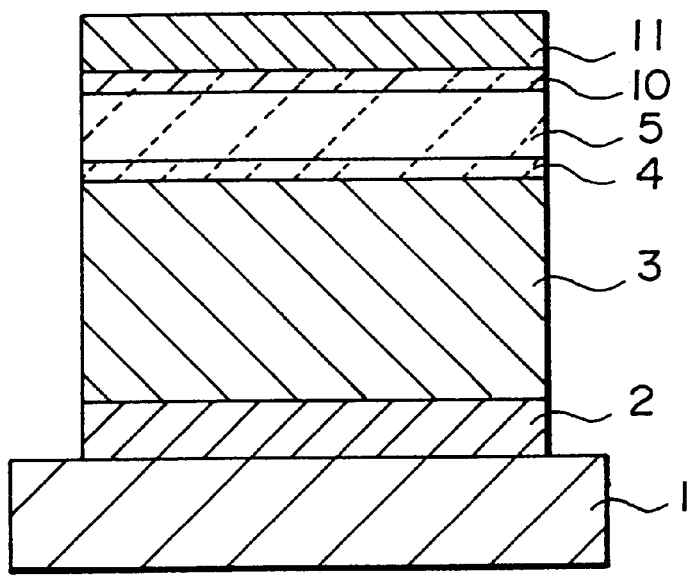
FIG. 6 to FIG. 11 are to illustrate the organic EL device of (6) to (13) of the invention.
Figure 7:
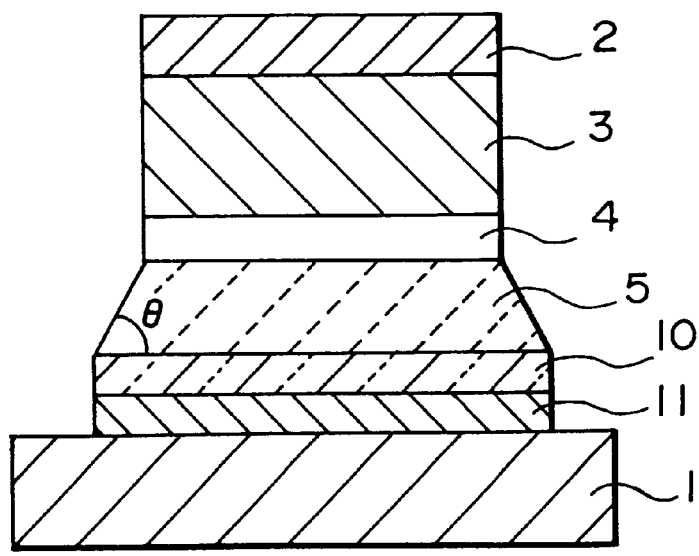
Figure 8:
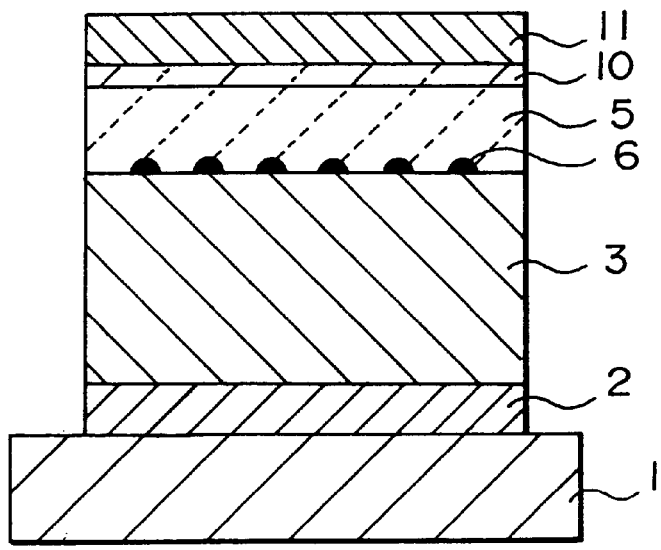
Figure 9:
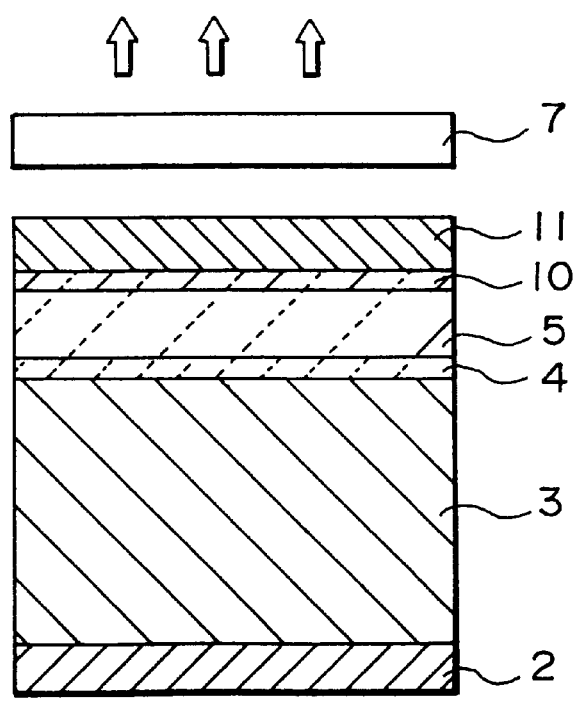
Figure 10:
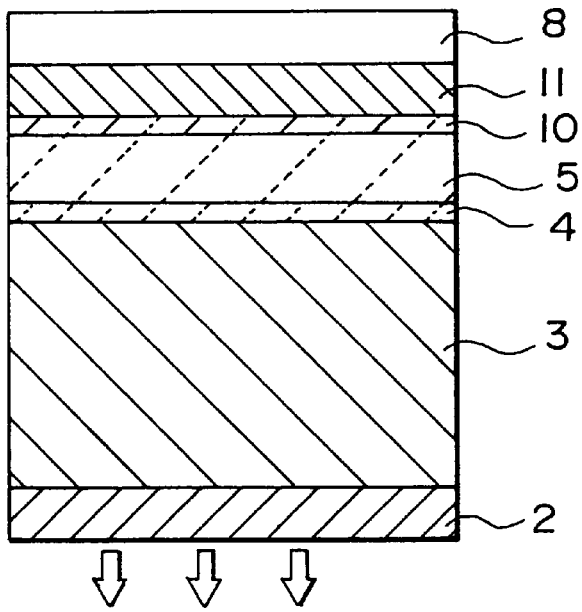
Figure 11:
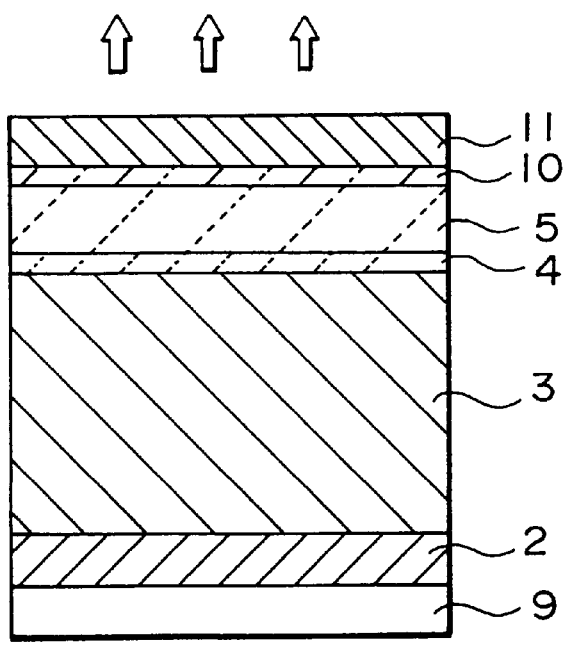

Precisely;

FIG. 1 is a cross-sectional view showing the structure of one embodiment of the organic EL device of the invention;

FIG. 2 is a cross-sectional view showing the structure of one embodiment of the organic EL device of the invention, in which an island-like electron injection zone exists in the interface between the amorphous transparent conductive film and the organic layer;

FIG. 3 is a cross-sectional view showing in a simplified manner one embodiment of using the organic EL device of the invention, in which a color filter is disposed outside the amorphous transparent conductive film;

FIG. 4 is a cross-sectional view showing in a simplified manner one embodiment of using the organic EL device of the invention, in which a black absorption layer is disposed outside the amorphous transparent conductive film;

FIG. 5 is a cross-sectional view showing in a simplified manner one embodiment of using the organic EL device of the invention, in which a background color-forming layer is disposed outside the transparent positive electrode;

FIG. 6 is a cross-sectional view showing the structure of one embodiment of the organic EL device of the invention;

FIG. 7 is a cross-sectional view showing the structure of one embodiment of the organic EL device of the invention, in which the amorphous transparent conductive film has a tapered cross-sectional profile;

FIG. 8 is a cross-sectional view showing the structure of one embodiment of the organic EL device of the invention, in which an island-like electron injection zone exists in the interface between the amorphous transparent conductive film and the organic layer;

FIG. 9 is a cross-sectional view showing in a simplified manner one embodiment of using the organic EL device of the invention, in which a color filter is disposed outside the amorphous transparent conductive film;

FIG. 10 is a cross-sectional view showing in a simplified manner one embodiment of using the organic EL device of the invention, in which a black absorption layer is disposed outside the amorphous transparent conductive film; and FIG. 11 is a cross-sectional view showing in a simplified manner one embodiment of using the organic EL device of the invention, in which a background color-forming layer is disposed outside the transparent positive electrode.

In those drawings, 1 is a substrate, 2 is a positive electrode, 3 is an organic layer, 4 is an electron injection electrode layer, 5 is an amorphous transparent conductive film, 6 is an island-like electron injection zone, 7 is a color filter, 8 is a black absorption layer, 9 is a background color-forming layer, 10 is a thin metal film, and 11 is a thin transparent film.

DESCRIPTION OF THE PREFERRED EMBODIMENTS

Now, the invention is described in detail hereinunder.

The organic EL device of (1) to (5) of the invention comprises an positive electrode, a negative electrode and an organic layer including an organic light-emitting layer as sandwiched between the two electrodes, in which the negative electrode is comprised of an electron injection electrode layer and an amorphous transparent conductive film, and in which the electron injection electrode layer is adjacent to the organic layer. The structure of this organic EL device is, for example, graphically shown as in FIG. 1. The structure of the organic EL device of this aspect of the invention is described in detail hereinunder.

Amorphous Transparent Conductive Film

First mentioned is the amorphous transparent conductive film constituting the negative electrode to be in the organic EL device of the invention. The amorphous transparent conductive film may be any and every one that is amorphous and transparent. As has been mentioned hereinabove, however, it is desirable that the film has a specific resistance value of not larger than $5 \times 10^{-4}$ Ω·cm, in order to prevent the voltage drops and to prevent the inhomogeneity of the light emission to be caused by the voltage drops.

It is also desirable that the film is made of an In—Zn—O oxide. The In—Zn—O oxide film as referred to herein is meant to indicate a transparent conductive film of an amorphous oxide that comprises indium (In) and zinc (Zn) as the essential cation elements. In this film, the atomic ratio, In/(In+Zn), is preferably between 0.45 and 0.90. This is because, if the atomic ratio is outside the defined range, the electroconductivity of the film will be low. In view of the electroconductivity of the film, the atomic ratio, In/(In+Zn), is more preferably between 0.50 and 0.90, even more preferably between 0.70 and 0.85.

The amorphous oxide may comprise substantially In and Zn only as the essential cation elements, but, if desired, may additionally comprise one or more third elements which are tri-valent or higher poly-valent cations. Specific examples of those third elements include tin (Sn), aluminium (Al), antimony (Sb), gallium (Ga), germanium (Ge), and titanium (Ti). Of those, preferred is Sn as increasing the electroconductivity of the film. Regarding the third element content of the oxide, it is desirable that the atomic ratio, (total third element)/[In+Zn+(total third element)] is not larger than 0.2. If the atomic ratio is larger than 0.2, the electroconductivity of the film will be lowered due to the carrier scattering of the ions in the film. Most preferably, the atomic ratio is not larger than 0.1. Comparing a crystalline film with an amorphous one, both having the same composition, the former has lower electroconductivity than the latter. Therefore, in the invention, the transparent conductive film must be amorphous.

The amorphous oxide is sheeted thin to be the transparent conductive film for use in the invention. The thickness of the film is preferably from about 3 to about 3000 nm. This is because, if the thickness of the film is smaller than 3 nm, the electroconductivity of the film will be too low, but if it is larger than 3000 nm, the light transmittance of the film will be too low, and, in addition, the film will be often cracked when the organic EL device comprising the film is intentionally or irreversibly deformed during or after the production of the device. The thickness of the transparent conductive film is more preferably from 5 to 1000 nm or so, even more preferably from 10 to 800 nm or so.

In the organic EL device of the invention, where the negative electrode is formed on the substrate via the positive electrode and the organic layer therebetween, the amorphous transparent conductive film (oxide film) is formed on the electron injection electrode layer. To form the amorphous transparent conductive film, employable is any of sputtering, chemical vapor deposition, sol-gel conversion and ion plating. Preferred is sputtering, as having few thermal influences on the organic layer and as being simple. In sputtering, care should be taken in order that the organic layer is not damaged by the plasma formed. In addition, since the organic layer has poor heat resistance, it is desirable that the temperature of the substrate is kept not higher than 200° C. during sputtering.

Regarding the mode of sputtering, employable is any of RF or DC magnetron sputtering and even reactive sputtering. The composition of the sputtering target to be used and the sputtering condition may be suitably determined, depending on the composition of the transparent conductive film to be formed.

Where the In—Zn—O type, transparent conductive film is formed through RF or DC magnetron sputtering, preferably used is any of the following sputtering targets (i) and (ii):

(i) A sintered target of a composition of indium oxide and zinc oxide, in which the atomic ratio of indium is a predetermined one.

The wording "the atomic ratio of indium is a predetermined one" as referred to herein is meant to indicate that the atomic ratio, In/(In+Zn), in the final film is a desired value falling between 0.45 and 0.90. For this, the atomic ratio in the sintered target may be nearly between 0.50 and 0.90. The sintered target may be a sintered body of a mixture of indium oxide and zinc oxide, or may be a sintered body substantially comprised of one or more phyllo-hexagonal compounds of $In_2O_3(ZnO)_m$ (where m=2 to 20), or may even be a sintered body substantially comprised of one or more phyllo-hexagonal compounds of $In_2O_3(ZnO)_m$ (where m=2 to 20), and $In_2O_3$ and/or ZnO. In the formula to represent the phyllo-hexagonal compounds, m is defined to be between 2 and 20. This is because, if m oversteps the defined range, the compounds could not be phyllo-hexagonal compounds.

(ii) A sputtering target composed of an oxide disc and one or more oxide tablets disposed on the disc.

In this, the oxide disc may be substantially comprised of indium oxide and zinc oxide, or may be of a sintered body substantially comprised of one or more phyllo-hexagonal compounds of $In_2O_3(ZnO)_m$ (where m=2 to 20), or may even be of a sintered body substantially comprised of one or more phyllo-hexagonal compounds of $In_2O_3(ZnO)_m$ (where m=2 to 20), and $In_2O_3$ and/or ZnO. The composition of the oxide tablet may be the same as that of the oxide disc. The composition of those oxide disc and oxide tablet and the ratio of the two may be suitably determined, depending on the intended atomic ratio, In/(In+Zn), to be between 0.45 and 0.80 in the final film to be formed.

It is desirable that the purity of the sputtering targets of (i) and (ii) is not lower than 98%. If the purity is lower than 98%, the wet heat resistance (durability) of the film to be formed, the electroconductivity thereof and even the light transmittance thereof will be lowered due to the impurities existing in the targets. The purity is more preferably not lower than 99%, even more preferably not lower than 99.9%.

Where the sintered target is used, its relative density is preferably not lower than 70%. If the relative density of the sintered target used is lower than 70%, the filming speed will be low, and the quality of the film formed will be poor. The relative density is more preferably not lower than 85%, even more preferably not lower than 90%.

The sputtering condition for the direct sputtering to form the transparent conductive film varies, depending on the direct sputtering method, the composition of the sputtering target and the characteristics of the sputtering device used, and therefore it is difficult to unconditionally define it. For DC direct sputtering, however, it is preferable to define the condition as follows:

The vacuum degree during sputtering and the voltage to be applied to the target are preferably defined as follows: The vacuum degree during sputtering is preferably from $1.3\times10^{-2}$ to $6.7\times10^0$ Pa or so, more preferably from $1.7\times10^{-2}$ to $1.3\times10^0$ Pa or so, even more preferably from $4.0\times10^{-2}$ to $6.7\times10^{-1}$ Pa or so. The voltage to be applied to the target is preferably from 200 to 500 V. If the vacuum degree during sputtering is lower than $1.3\times10^{-2}$ Pa (that is, if the pressure in the sputtering chamber is lower than $1.3\times10^{-2}$ Pa), the stability of the plasma formed is low. However, if the vacuum degree is higher than $6.7\times10^0$ Pa (that is, if the pressure in the sputtering chamber is higher than $6.7\times10^0$ Pa), the voltage to be applied to the sputtering target could not be increased. If the voltage to be applied to the target is lower than 200 V, good thin films will be difficult to obtain, and the filming speed will be limited.

The gaseous atmosphere in the sputtering chamber is preferably of a mixed gas comprising an inert gas such as argon gas, and oxygen gas. Where argon gas is used as the inert gas, the mixing ratio by volume of argon gas to oxygen gas may be approximately from 1/1 to 99.99/0.01, but preferably approximately from 9/1 to 99.99/0.1. If the ratio oversteps the defined range, films with low resistance and high light transmittance could not be obtained.

The substrate temperature may be suitably determined, depending on the heat resistance of the organic layer, and may fall within a temperature range within which the organic layer is neither deformed nor deteriorated under heat. However, if the substrate temperature is lower than room temperature, any additional cooling device will be needed, resulting in the increase in the production costs. With the increase in the substrate temperature, the production costs will increase. Therefore, the substrate temperature is preferably between room temperature and 200° C.

As a result of the direct sputtering that uses the sputtering target of (i) or (ii) under the condition mentioned above, the intended transparent conductive film can be formed on the organic layer.

Electron Injection Electrode Layer

Now described is the electron injection electrode layer constituting the organic EL device of the invention. The electron injection electrode layer is meant to indicate an electrode layer that attains good electron injection into the organic layer including a light-emitting layer. To obtain transparent EL devices, it is desirable that the electron injection electrode layer has a light transmittance of not smaller than 50%. For this, the layer is desirably of an ultra-thin film having a thickness of from 0.5 to 20 nm or so.

The electron injection electrode layer maybe, for example, of a film of a metal having a work function of not larger than 3.8 eV, or that is, an electron-injecting metal, such as Mg, Ca, Ba, Sr, Li, Yb, Eu, Y, Sc or the like, and the film may have a thickness of from 1 nm to 20 nm or so. It is desirable that the film for the layer of that type has a light transmittance of not smaller than 50%, preferably not smaller than 60%.

Another preferred embodiment of the electron injection electrode layer is made of an alloy of one or more metals having a work function of not larger than 3.8 eV, such as those mentioned above, and a metal having a work function of not larger than 4.0 eV. The alloy for the layer is an electron-injecting alloy. The alloy may be any and every one capable of forming the intended electron injection electrode layer, and includes, for example, aluminium-lithium alloys, magnesium-aluminium alloys, indium-lithium alloys, lead-lithium alloys, bismuth-lithium alloys, tin-lithium alloys, aluminium-calcium alloys, aluminum-barium alloys, and aluminum-scandium alloys. It is desirable that the film of the alloy has a thickness of from 1 nm to 20 nm or so, and has a light transmittance of not smaller than 50%, preferably not smaller than 60%.

Where the electron injection electrode layer is formed from any of the metals and the alloys mentioned above, preferably employed is electrically-heating vapor deposition. For this, it is desirable that the substrate temperature is defined between 10 and 100° C. and the deposition rate is defined between 0.05 and 20 nm/sec.

In particular, where the alloy is deposited, employable is binary vapor deposition in which the deposition rate for the two different metals used may be differently defined. For this, for example, the deposition rate for Li, Ba, Ca, Sc or Mg is defined to fall between 0.01 and 0.1 nm/sec while that for the matrix metal, Al or the like is defined to fall between 1 and 10 nm/sec, and the different metals can be deposited all at once. Apart from that binary vapor deposition, also employable is single vapor deposition for the alloy. For this, prepared are vaporizing alloy pellets or granules that contain an electron-injecting metal as added to the matrix metal in a predetermined ratio, and these pellets or granules are put in the electrically-heating boat or around the electrically-heating filaments in the vapor deposition chamber. After having been heated in the chamber, the pellets or granules are vaporized and deposited to form the intended electron injection electrode layer.

Still another preferred embodiment of the electron injection electrode layer is of an ultra-thin film of an electron-injecting, alkaline earth metal oxide having a thickness of from 0.1 nm to 10 nm or so. Preferred examples of the alkaline earth metal oxide are BaO, SrO, CaO, and their mixtures of, for example, $Ba_xSr_{1-x}O$ (where $0<x<1$) and $Ba_xCa_{1-x}O$ (where $0<x<1$).

To form the alkaline earth metal oxide layer, preferred is an electrically-heating vapor deposition method, in which an alkaline earth metal is vaporized in a vacuum chamber while oxygen is introduced thereinto at a vacuum degree of from $10^{-4}$ to $10^{-3}$ Pa, and the alkaline earth metal vapor is reacted with oxygen and deposited. Also preferred is an electron beam vapor deposition method in which are used electron beams to form the intended alkaline earth metal oxide film.

Not only one but also two or more of the electron-injecting metals, alloys and alkaline earth metal oxides mentioned hereinabove can be used to form the electron injection electrode layer.

Still another preferred embodiment of the electron injection electrode layer is a mixed layer of a mixture comprised of an electron-injecting metal, alloy or alkaline earth metal oxide, and an electron-transporting compound.

In this mixed layer, the electron-injecting metal, alloy or alkaline earth metal oxide may be any of the metals, alloys and alkaline earth metal oxides mentioned hereinabove. The mixed layer may comprise one or more of those metals, alloys and oxides. The electron-transporting compound to be in the mixed layer maybe any and every compound capable of transporting electrons. For this, preferred are oxanoid chelates, and more preferred are compounds of the following formula:

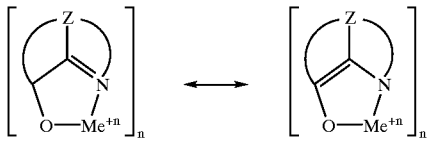

wherein Me represents a metal; n represents an integer of from 1 to 3; and Z independently represents an atom of completing the nucleus having at least two condensed aromatic rings.

In that formula, the metal of Me may be any of monovalent to tri-valent metals having the ability to form chelates, and includes, for example, alkali metals such as lithium, sodium and potassium, alkaline earth metals such as magnesium and calcium, and tri-valent metals such as boron and aluminium. Z represents an atom of completing the heterocyclic nucleus having at least two condensed aromatic rings. The heterocyclic nucleus to be completed by Z includes, for example, azole rings and azine rings.

The preferred oxanoid chelates include, for example, aluminium trisoxine, magnesium bisoxine, bis[benzo(f)-8-quinolinol]zinc, bis(2-methyl-8-quinolinolato)aluminium oxide, indium trisoxine, aluminium tris(5-methyloxine), lithium oxine, gallium trisoxine, calcium bis (5-chlorooxine), poly[zinc(II)-bis(8-hydroxy-5-quinolinyl)methane], and dilithium epindoridione.

The mixing ratio (by weight) of the electron-injecting metal, alloy and alkaline earth metal oxide to the electron-transporting compound is preferably between 100/1 to 1/100.

The mixed layer comprising the electron-injecting metal or alloy and the electron-transporting compound is preferably formed through binary co-vapor deposition, in which the substrate temperature may fall between 10 and 100° C.

Still another preferred embodiment of the organic EL device of the invention is such that the electron injection electrode layer comprises an island-like electron injection zone. The wording "island-like" as referred to herein is meant to indicate a structure comprising discontinuous electron-injecting compound layers formed on the organic layer, as in FIG. 2, in which the layers do not entirely cover the surface of the organic layer.

The island-like electron injection zone comprises discontinuous islands of, for example, metals, oxides, metal borides, metal nitrides or metal silicides having a low work function of not larger than 3.8 eV, in which the shape and the size of each is land are not specifically defined, but preferably, each island is fine granular or crystalline one having a size of from 0.5 nm to 5 µm or so.

The electron injection zone is neither of a thin filmy one nor of a dispersion of individual atoms, but is of a dispersion of granular metals or compounds having a low work function, such as those mentioned hereinabove, as dispersed on the thin conductive film or in the organic compound layer. As being dispersed in that condition, the contact area between the granular metals or compounds and the organic compound layer is enlarged, resulting in that the electron-injecting ability of the electron injection zone is enhanced.

Preferably, the metals and alloys with a low work function that constitute the island-like electron injection zone have a work function of not larger than 3.8 eV, and include, for examples, those mentioned hereinabove. As the oxides with a low work function, preferred are alkali metal or alkaline earth metal oxides, and more preferred are CaO, BaO and SrO. Also preferred are solid solutions comprising these oxides and other metal oxides. As the metal borides and metal nitrides with a low work function, for example, preferred are borides of rare earth metals, silicides of rare earth metals, and TiN.

To form the island-like electron injection zone, for example, employable is any of electrically-heating vapor deposition and electron beam vapor deposition. In the latter, metal borides, metal nitrides or oxides having a high melting point are formed into discontinuous islands through electron beam vapor deposition.

In the organic EL device of the invention, the electron injection electrode layer and the amorphous transparent conductive film constitute the negative electrode. In this, therefore, the electron injection electrode layer which easily deteriorates is protected with the amorphous transparent conductive film. Accordingly, the organic EL device of the invention is advantageous in that the electron injection electrode layer can be thinned and, as a result, the negative electrode can be transparent.

In the organic EL device of the invention, the electron injection electrode layer is kept adjacent to the organic layer, in which electrons are injected into the organic layer from the negative electrode while positive holes are injected thereinto from the positive electrode.

To produce the organic EL device of the invention, in general, a positive electrode is positioned over a substrate, and an organic layer is superposed over the positive electrode. In this case, an electron injection electrode layer is formed over the organic layer including an organic light-emitting layer. To form the electron injection electrode layer, employable is any of the above-mentioned methods. Another preferred method for the formation is of sputtering, in which, however, care should be taken in order that the organic layer is not damaged by the plasma used.

Organic Layer

In the organic EL device of the invention, an organic layer is interposed between the positive electrode and the negative electrode, and this includes at least a light-emitting layer. The organic layer may be of only a light-emitting layer, but may also be of a multi-layered laminate structure comprising a light-emitting layer and a hole injection and transportation layer.

In the organic EL device, the light-emitting layer has (1) a function of receiving positive holes from the positive electrode or the hole transportation layer and receiving electrons from the electron injection layer in an electric field, (2) a transporting function of moving the thus-injected charges (electrons and positive holes) due to the force of the electric field, and (3) a light-emitting function of providing the site for recombination of the electrons and positive holes in its inside, thus producing the intended light emission. The kind of the light-emitting material to be used for forming the light-emitting layer is not specifically defined, and any conventional light-emitting materials used in ordinary organic EL devices are employable.

The hole injection and transportation layer comprises a hole-transmitting compound, while having a function of transporting the holes as injected thereinto from the positive electrode into the light-emitting layer. The hole injection and transportation layer is interposed between the positive electrode and the light-emitting layer, and hence many positive holes are injected into the light-emitting layer even in a lower electric field. In addition, the electrons as injected from the electron injection layer into the light-emitting layer form an electron barrier around the interface between the light-emitting layer and the hole injection and transportation layer, while being accumulated around the interface, to thereby increase the light-emitting efficiency of the EL device. Having this structure, the light-emitting capacity of the EL device of the invention is high. The hole-transporting compound to be used for forming the hole injection and transportation layer is not specifically defined, and any conventional one known usable in ordinary organic EL devices is employable. The hole injection and transportation layer may have not only a single-layered structure but also a multi-layered one.

Positive Electrode

The positive electrode to be in the organic EL device of the invention is not specifically defined, provided that it is electroconductive and has a work function of not smaller than 4.8 eV. Preferred are metals or transparent conductive films (conductive oxide films) having a work function of not smaller than 4.8 eV, or even their combinations. The positive electrode is not always necessary to be transparent, but may be coated with, for example, a black carbon layer or the like.

Preferred metals for the positive electrode are, for example, Au, Pt, Ni, and Pd. Preferred conductive oxides are, for example, In—Zn—O, In—Sn—O, ZnO—Al, and Zn—Sn—O. The positive electrode may also be a laminate, such as Au/In—Zn—O laminate, Pt/In—Zn—O laminate, or In—Sn—O/Pt laminate.

The positive electrode is to be such that its interface adjacent to the organic layer has a work function of not smaller than 4.8 eV. Therefore, the positive layer may be comprised of two layers, of which one not adjacent to the organic layer may be a conductive film having a work function of smaller than 4.8 eV. For the conductive film, employable are metals such as Al, Ta and W, and even alloys such as Al alloys and Ta-W alloys. Further employable are doped conductive polymers such as doped polyaniline and doped polyphenylene-vinylene; amorphous semiconductors such as α-Si, α-SiC and α-C; and fine crystals of, for example, $\mu$C-Si and $\mu$C-SiC. Still further employable are black semiconductive oxides, such as $Cr_2O_3$, $Pr_2O_5$, NiO, $Mn_2O_5$ and $MnO_2$.

The thickness of the positive electrode is preferably between 50 and 300 nm or so. If its thickness is smaller than 50 nm, the positive electrode will have too high resistance. However, if larger than 300 nm, the upper films of the organic layer and the negative electrode will be cut at the edges of the patterned positive electrode.

Constitution of Organic EL Device

In the organic EL device of the invention, it is indispensable that an organic layer including an organic light-emitting layer is interposed between the positive electrode and the negative electrode, that the negative electrode is comprised of an electron injection electrode layer and an amorphous transparent conductive film, and that the electron injection electrode layer is adjacent to the organic layer. Satisfying that basic constitution, the organic EL device attains the objects of the invention. In addition to the basic constitution, the organic EL device of the invention may further comprise any additional constitution to have additional functions. Some embodiments comprising the structure of the organic EL device of the invention are mentioned below.

①  Transparent positive electrode/organic layer/electron injection electrode layer/amorphous transparent electrode.

②  Positive electrode/organic layer/electron injection electrode layer/amorphous transparent electrode/color filter.

③  Positive electrode/organic layer/electron injection electrode layer/amorphous transparent electrode/color-converting layer.

④  Transparent positive electrode/organic layer/electron injection electrode layer/amorphous transparent electrode/black absorption layer.

⑤  Transparent positive electrode/organic layer/electron injection electrode layer/amorphous transparent electrode/background color-forming layer.

⑥  Black absorption layer/transparent positive electrode/organic layer/electron injection electrode layer/amorphous transparent electrode.

⑦  Background color-forming layer/transparent positive electrode/organic layer/electron injection electrode layer/amorphous transparent electrode.

In the structure ①, the both electrodes are transparent. Therefore, this is a transparent display device.

In the structures ② and ③, the positive electrode is formed on the supporting substrate, and the light emission can be taken out through the side opposite to the substrate. Therefore, these do not require the provision of the positive electrode on the color filter or the color-converting layer. Accordingly, these are greatly advantageous in that a process in which the substrate temperature is to be 150° C. or higher can be employed for forming the positive electrode and that the resistance of the positive electrode can be reduced much. In addition, since the color filter and the color-converting layer is formed after the formation of the positive electrode, any high-temperature process is employable with no trouble for preventing the deterioration of the constituent layers. FIG. 3 shows the structure ②. In the structure ③, the color-converting layer is preferably made of a transparent polymer containing fluorescent dyes, in which the EL light emission is converted into a different color by the fluorescent dye.

Where the structures ② and ③ comprise a large number of pixels, additional wires and TFT (thin film transistors) are formed on the substrate in addition to the positive electrode. Therefore, in those, if the light emission is taken out through the substrate, it is blocked by the additional wires and TFT to lower the aperture ratio for taking out the light from the display device, unfavorably resulting in that the luminance of the display device is lowered and that the quality of the image formed is worsened. However, in those structures comprising the organic EL device of the invention, the light emission can be taken out through the side opposite to the substrate, it is not blocked by the additional elements without lowering the aperture ratio for taking out the light to give pixels in the display device.

In the structures ④ and ⑥, the pixels are seen black when the device is off. Therefore, those structures are advantageous in that the external light being applied to the device does not reflect on its surface and therefore the contrast of the display is increased. FIG. 4 shows the structure ④.

The structures ⑤ and ⑦ can have various background colors and patterns. Therefore, the display devices with those structures could be decorative ones even while they are off. FIG. 5 shows the structure ⑦.

In the structures of ② to ⑦, the color-converting layer, the color filter, the black absorption layer, and the background color-forming layer are not always to be air tightly attached to the electrode, but may be attached thereto via an interlayer. Provided that their effect can be attained, those constituent elements can be disposed apart from the electrode, for example, as in FIG. 3. However, the color-converting layer and the color filter must be disposed in the side through which the light emission is taken out, while the black absorption layer and the background color-forming layer must be disposed opposite to the side through which the light emission is taken out.

Now described in detail hereinunder is the organic EL device of (6) to (13) of the invention, which comprises an positive electrode, a negative electrode and an organic layer including an organic light-emitting layer as sandwiched between the two electrodes, and in which the negative electrode is comprised of an electron injection electrode layer, a transparent conductive film and a thin metal film having a specific resistance of not larger than $1\times10^{-5}$ $\Omega\cdot cm$, as laminated in that order with the electron injection electrode layer being adjacent to the organic layer, and that a thin transparent film is formed outside the negative electrode. One basic structure of this organic EL device is shown in FIG. 6. The elements constituting the negative electrode and the thin transparent film to be disposed outside the negative electrode in this organic EL device are described in detail hereinunder.

Thin Metal Film

The thin metal film is to lower the sheet resistivity of the negative electrode, and is thinned to such a degree that it can transmit light therethrough. The metal to be the thin metal film having a specific resistance of not larger than $1\times10^{-5}$ $\Omega\cdot cm$ includes, for example, silver (Ag), gold (Au), aluminium (Al), lutetium (Lu), nickel (Ni), and platinum (Pt). Of those, preferred are Ag, Au and Pt having a low specific resistance and capable of being formed into thin films; and more preferred is Ag.

The characteristic of the invention resides in the point that the transparency of the negative electrode is increased. Therefore, it is desirable that the light transmittance of the thin metal film layer is between 70 and 90%. For this, the thickness of the film layer is preferably between 2 and 20 nm, more preferably between 2 and 10 nm.

To form the film layer, employable is any and every means of forming thin films, including, for example, electrically-heating vapor deposition, electron beam vapor deposition, and even RF or DC magnetron sputtering. Where the organic layer, the electron injection electrode layer and the transparent conductive layers are previously formed prior to the formation of the thin metal film, preferably employed are an electrically-heating vapor deposition method, and a helicon sputtering method which is one example of DC magnetron sputtering modes, since these methods have few thermal influences on those previously-formed layers. Especially preferred is the electrically-heating vapor deposition method. The transparent conductive film which is to be adjacent to the thin metal film and which will be mentioned in detail hereinunder is preferably formed through sputtering. Therefore, considering the advantage in using the same apparatus and the same process for the formation of the two, the thin metal film and the transparent conductive film, the method for forming the thin metal film shall be suitably determined.

In the organic EL device of this structure, the lead wires for the electrode are taken through the thin metal film or through the thin transparent film formed outside the thin metal film, and electrons are injected into the organic layer via the electron injection electrode layer, the transparent conductive film and the thin metal film.

Transparent Conductive Film

In the organic EL device of the invention, where the thin metal film is laminated over the transparent conductive film, the transparent conductive film may be a crystalline one such as ITO film or $SnO_2$ film. However, it is desirable that the transparent conductive film itself has a low specific resistance of, for example, not larger than $5\times10^{-4}$ $\Omega\cdot cm$.

One preferred example of the transparent conductive film is an amorphous transparent conductive film, which may be the same as that mentioned hereinabove for the embodiments (1) to (5) of the invention.

In particular, in order to make the organic EL device of the invention has better durability (wet heat resistance) and to make it usable in the formation of high-resolution display devices, the transparent conductive film that constitutes the negative electrode must be an amorphous one. The material and the size of the amorphous transparent conductive film and also the method for producing the film may be the same as those mentioned hereinabove.

In display devices comprising an organic EL device, in general, positive and electrodes lines are constructed to give XY matrices, in which are formed pixels at intersections. Therefore, for high-resolution display devices, the positive and negative electrodes lines must be thin. Concretely, after having been formed in thin films, the filmy electrodes are etched to give patterned lines. In this case, if the adjacent electrode lines are kept in contact with each other, they unfavorably give a cross-talk and prevent XY matrix display from forming pictures.

For such high-resolution patterning, the amorphous transparent conductive film, especially that made from an oxide of In—Zn—O is preferred, since it can be etched to have a trapezoidal (tapered) cross-sectional profile. If the negative electrode is first formed on the substrate, the organic layer as laminated over the negative electrode and the positive electrode as superposed over the organic layer are also prevented from being cut at the edges of the patterned lines of the amorphous transparent conductive layer.

To etch the transparent conductive film to give a pattern having a tapered cross-sectional profile, preferred is dry etching. More preferably, the film is so etched that the angle (θ) between the bottom surface and the side surface of the linewise etched pattern of the transparent conductive film falls between 30 and 60 degrees. As the etching gas, for example, employable is a mixed gas of methane and hydrogen chloride. One embodiment of the organic EL device of the invention, in which the transparent conductive film was etched to have a tapered cross-sectional profile, is graphically shown in FIG. 7.

Electron Injection Electrode Layer

The electron injection electrode layer to be in the embodiments (6) to (13) of the invention maybe the same as that to be in the embodiments (1) to (5) mentioned hereinabove.

Thin Transparent Film

In the embodiments (6) to (13), the thin metal film may constitute the outermost layer, which must be protected with an additional layer. However, the first object of the invention is to provide the organic EL device having a light-transmitting negative electrode, the protective layer must be a light-transmitting one.

As the layer of that type, any known thin films of glass or plastics may be employed. When the organic EL device of the invention is produced by first forming the positive electrode on the substrate followed by forming the other layers thereon, it is desirable that a thin, transparent dielectric film or a transparent conductive film is formed on the thin metal film. The thin, transparent dielectric film is preferred, as being a transparent protective film having a higher light transmittance because of its refractive index.

As the thin, transparent dielectric film, for example, used is a thin crystalline film of $TiO_2$ or the like. As the transparent conductive film, for example, used is a thin crystalline film of ITO, $SnO_2$ or the like, or an amorphous transparent conductive film of In—Zn—O or the like. The amorphous transparent conductive film is preferred, as favorably improving the durability of the organic EL device while satisfying the second object of the invention. This film is not always required to be electroconductive. Therefore, where the thin, transparent dielectric film is used, the lead wires for the electrode may be taken from the thin metal film.

To form the protective layer, preferably employed is RF magnetron sputtering, more preferably helicon sputtering.

Light Transmittance and Sheet Resistivity

The organic EL device to attain the first object of the invention may have another constitution comprising an positive electrode, a negative electrode and an organic layer including an organic light-emitting layer as sandwiched between the two electrodes, in which a thin transparent film is formed outside the negative electrode, the layer comprised of the negative electrode and the thin transparent film has a light transmittance of not smaller than 60%, and the layer comprised of the negative electrode and the thin transparent film, or the negative electrode has a sheet resistivity of not larger than 10 Ω/square.

The negative electrode for the organic EL device having this constitution may be the same as that mentioned hereinabove, and the thin transparent film for it may also be the same as that mentioned hereinabove.

The light transmittance defined herein is meant to indicate the percentage of light that passes through the layer adjacent to the organic layer (e.g., electron injection electrode layer) to the thin transparent film formed outside the negative electrode in the organic EL device.

The light transmittance shall be not smaller than 60% for visible light region (having a wavelength of from 380 to 700 nm) To measure the light transmittance, employed is any known spectrophotometer. It is unnecessary to prepare the layer comprised of the negative electrode and the thin transparent film to be formed over the negative electrode to measure the light transmittance of the layer. In the organic EL device of the invention, when the light transmittance through the layer as combined with the other layers is not smaller than 60%, then the light transmittance through the layer only shall naturally be not smaller than 60%.

The sheet resistivity (Ω/square) defined herein is measured according to a four-probe method. Concretely, a layer comprised of the same negative electrode and the same thin transparent film as those in the organic EL device, or a film of the same negative electrode as that in the organic EL device is prepared, and the sheet resistivity of the negative electrode layer or that of the thin transparent film layer is measured according to a four-probe method.

Organic Layer

The organic layer to be in the embodiments (6) to (13) may be the same as that to be in the embodiments (1) to (5) mentioned hereinabove.

Positive Electrode

The positive electrode to be in the embodiments (6) to (13) may be the same as that to be in the embodiments (1) to (5) mentioned hereinabove.

Constitution of Organic EL Device

In the organic EL device of the invention, it is indispensable that an organic layer including an organic light-emitting layer is interposed between the positive electrode and the negative electrode, that the negative electrode is comprised of an electron injection electrode layer, a transparent conductive film and a thin metal film, that the electron injection electrode layer is adjacent to the organic layer, and that a thin transparent film is formed outside the negative electrode; or it is indispensable that an organic layer including an organic light-emitting layer is interposed between the positive electrode and the negative electrode, that the layer comprised of the negative electrode and the thin transparent film formed outside the negative electrode has a light transmittance of not smaller than 60%, and that the sheet resistivity of the layer comprised of the negative electrode and the thin transparent film or that of the negative electrode itself is not smaller than 10 Ω/square. Satisfying any of those basic constitutions, the organic EL device attains the first object of the invention. In addition, where the transparent conductive film in the organic EL device is an amorphous one, the device attains the second object of the invention.

In addition to the basic constitutions, the organic EL device of the invention may further comprise any additional constitution to have additional functions. Some embodiments comprising the structure of the organic EL device of the invention are mentioned below.

① Transparent positive electrode/organic layer/electron injection electrode layer/amorphous transparent conductive film/thin metal film/transparent conductive film.

② Positive electrode/organic layer/electron injection electrode layer/amorphous transparent conductive film/thin metal film/transparent conductive film/color filter.

③ Positive electrode/organic layer/electron injection electrode layer/amorphous transparent conductive film/thin metal film/transparent conductive film/color-converting layer.

④ Transparent positive electrode/organic layer/electron injection electrode layer/amorphous transparent conductive film/thin metal film/transparent conductive film/black absorption layer.

⑤ Transparent positive electrode/organic layer/electron injection electrode layer/amorphous transparent conductive film/thin metal film/transparent conductive film/background color-forming layer.

⑥ Black absorption layer/transparent positive electrode/ organic layer/electron injection electrode layer/ amorphous transparent conductive film/thin metal film/ transparent conductive film.

⑦ Background color-forming layer/transparent positive electrode/organic layer/electron injection electrode layer/amorphous transparent conductive film/thin metal film/transparent conductive film.

In the structure ①, the both electrodes are transparent. Therefore, this is a transparent display device.

In the structures ② and ③, the positive electrode is formed on the supporting substrate, and the light emission can be taken out through the side opposite to the substrate. Therefore, these do not require the provision of the positive electrode on the color filter or the color-converting layer. Accordingly, these are greatly advantageous in that a process in which the substrate temperature is to be 150° C. or higher can be employed for forming the positive electrode and that the resistance of the positive electrode can be reduced much. In addition, since the color filter and the color-converting layer is formed after the formation of the positive electrode, any high-temperature process is employable with no trouble for preventing the deterioration of the constituent layers. FIG. 9 shows the structure ②. In the structure ③, the color-converting layer is preferably made of a transparent polymer containing a fluorescent dye, in which the EL light emission is converted into a different color by the fluorescent dye.

Where the structures ② and ③ comprise a large number of pixels, additional wires and TFT (thin film transistors) are formed on the substrate in addition to the positive electrode. Therefore, in those, if the light emission is taken out through the substrate, it is blocked by the additional wires and TFT to lower the aperture ratio for taking out the light from the display device, unfavorably resulting in that the luminance of the display device is lowered and that the quality of the image formed is worsened. However, in those structures comprising the organic EL device of the invention, the light emission can be taken out through the side opposite to the substrate, it is not blocked by the additional elements without lowering the aperture ratio for taking out the light to give pixels in the display device.

In the structures ④ and ⑥, the pixels are seen black when the device is off. Therefore, those structures are advantageous in that the external light being applied to the device does not reflect on its surface and therefore the contrast of the display is increased. FIG. 10 shows the structure ④.

The structures ⑤ and ⑦ can have various background colors and patterns. Therefore, the display devices with those structures could be decorative ones even while they are off. FIG. 11 shows the structure ⑦.

In the structures of ② to ⑦, the color-converting layer, the color filter, the black absorption layer, and the background color-forming layer are not always to be airtightly attached to the electrode, but maybe attached thereto via an interlayer. Provided that their effect can be attained, those constituent elements can be disposed apart from the electrode, for example, as in FIG. 9. However, the color-converting layer and the color filter must be disposed in the side through which the light emission is taken out, while the black absorption layer and the background color-forming layer must be disposed opposite to the side through which the light emission is taken out.

Now, the invention is described in more detail with reference to the following Examples. Examples 1 to 4 are to demonstrate the embodiments (1) to (5), while Examples 5 to are to demonstrate the embodiments (6) to (13). These Examples are not intended to restrict the scope of the invention.

EXAMPLE 1
Production of Organic EL Device

A member comprised of a 25 mm×75 mm×1 mm glass substrate and a 100 nm thick conductive film of ITO provided on the glass substrate (manufactured by Geomatic) was used as a conductive film-covered substrate. This was dipped in isopropyl alcohol and ultrasonically washed therein, and then cleaned with ultraviolet rays with ozone for 30 minutes using an ultraviolet cleaner, UV-300 (manufactured by Samco International Co., Ltd.).

This ITO-covered glass substrate was mounted onto a substrate holder of a commercially-available vacuum vapor deposition system, which was degassed to a vacuum degree of $5 \times 10^{-4}$ Pa. Installed in the system were electrically-heating boats, each of which was loaded with Copper phthalocyanine (hereinafter referred to as CuPc), N,N'-bis(3-methylphenyl)-N,N'-diphenyl(1,1'-biphenyl)-4,4'-diamine (hereinafter referred to as TPD) and 8-quinolinol aluminium complex (aluminium trisoxine, hereinafter referred to as Alq) of 200 mg each, and electrically-heating filaments with aluminium-lithium alloy (Li content: 2% by weight). These boats and filaments were heated in sequence, whereby the components in those were vaporized and deposited on the ITO-covered glass substrate.

Briefly, CuPc was first deposited on the substrate to form thereon a first hole injection and transportation layer having a thickness of 25 nm, then TPD was to form a second hole injection and transportation layer having a thickness of 40 nm, and finally Alq was to form a light-emitting layer having a thickness of 60 nm. Next, the thus-formed laminate was partly masked, and the aluminium-lithium alloy was deposited thereon to form an electron injection electrode layer having a thickness of 7 nm.

Next, the substrate was transferred to a different vacuum chamber as connected with the system, and mounted onto its substrate holder, while the vacuum degree in the chamber was still kept as above. The vacuum chamber was so designed that an In—Zn—O oxide film could be formed through DC magnetron sputtering, in which the target for forming the In—Zn—O oxide film was a sintered body comprised of $In_2O_3$ and ZnO in an atomic ratio, In/(In+Zn), of being 0.67. A mixed gas of argon and oxygen (argon/oxygen=1000/2.8 by volume) was introduced into the vacuum chamber to be at $3 \times 10^{-1}$ Pa. Under this condition, the sintered body was sputtered onto the substrate at a sputtering output of 20 W and at room temperature for the substrate to thereby form an amorphous transparent conductive film having a thickness of 200 nm on the substrate. The amorphous structure of the In—Zn—O oxide film formed herein was confirmed by separately forming the same laminate as above on a nude glass substrate not coated with the thin ITO film, followed by analyzing it through X-ray diffractometry.

On the other hand, a laminate comprised of the electron injection electrode layer and the amorphous transparent conductive film was directly formed on the ITO-covered glass substrate in the same manner as above, and the light transmittance at 460 nm of the laminate was measured to be 63%, which verified the high transparency of the laminate.

Evaluation of Organic EL Device

The sheet resistivity of the amorphous transparent conductive film formed herein was measured, according to a four-probe method using Loresta FP (manufactured by Mitsubishi Petrochemical Co.), to be 17 Ω/square. Since the film had a thickness of 200 nm, its specific resistance was confirmed to be $3.4 \times 10^{-4}$ Ω·cm, which verified the low resistance of the film.

Next, a voltage of 8 V was applied to the device sample with the thin ITO film acting as a positive electrode and the amorphous transparent conductive film acting as a negative electrode, and a current density was measured to be 3.1 mA/cm². The light emission by the device sample was measured at the side of the amorphous transparent conductive film to be 60 cd/m². The color of this light from the Alq emitting layer was green.

After having been kept in air having a relative humidity of 70% RH for 100 hours, this device sample still kept its original light-emitting capacity without having any non-emissive points visible to the naked eye.

Comparative Example 1

An organic EL device was produced in the same manner as in Example 1, except that a crystalline transparent conductive film of ITO was formed using a commercially-available ITO target, in place of forming the In—Zn—O oxide film.

Next, this device was evaluated in the same manner as in Example 1, and gave the following data. The sheet resistivity of the crystalline film was 130 Ω/square. Since the film had a thickness of 200 nm, its specific resistance was confirmed to be $2.6 \times 10^{-3}$ Ω·cm, which verified the high resistance of the film. Next, a voltage of 8 V was applied to the device sample, and a current density was measured to be 4 mA/cm². The light emission by the device sample was measured at the side of the crystalline transparent conductive film to be 60 cd/m². The color of the light from the Alq emitting layer was green. After having been kept in an atmosphere having a relative humidity of 70% RH for 100 hours, this device was found to have numerous non-emissive points visible to the naked eye, and was found to have many emission defects.

Those test data verify the superiority of the organic EL device of the invention in that its luminous efficiency is high since its negative electrode has high transparency and since the amorphous transparent conductive film constituting the negative electrode has low resistance, and that it has good durability with producing few emission defects since its negative electrode comprises the amorphous transparent conductive film. It is known that the oxidation of an electron injection electrode layer in an organic EL device produces emission defects. In the organic EL device of the invention, however, since an amorphous transparent conductive film is formed over the electron injection electrode layer, and since the transparent conductive film has no grain boundaries, it is believed that oxygen and water are prevented from penetrating into the electron injection electrode layer, thereby producing the results as above.

EXAMPLE 2
Production of Organic EL Device

The same ITO-covered glass substrate as that used in Example 1 was mounted onto the substrate holder of the same vacuum vapor deposition system as in Example 1, which was degassed to a vacuum degree of $5 \times 10^{-4}$ Pa. Installed in the system were electrically-heating boats, each of which was loaded with CuPc, TPD and Alq of 200 mg each, and an electrically-heating boat with aBa metal.

CuPc was first deposited on the ITO-covered glass substrate at a thickness of 25 nm, then TPD was at a thickness of 40 nm, and finally Alq was at a thickness of 60 nm. Next, the thus-formed laminate was partly masked, and oxygen was introduced into the vacuum chamber to be at $1 \times 10^{-3}$ Pa, in which barium (Ba) was deposited on the laminate at a thickness of 1.0 nm to form an electron injection electrode layer of BaO. In this, Ba reacted with oxygen existing in the vacuum chamber to give the electron injection electrode layer of BaO.

Next, the substrate was transferred to a different vacuum chamber as connected with the system, and mounted onto its substrate holder, while the vacuum degree in the chamber was still kept as above. The vacuum chamber was so designed that an In—Zn—O oxide film could be formed through DC magnetron sputtering, in which the target for forming the In—Zn—O oxide film was a sintered body comprised of $In_2O_3$ and ZnO in an atomic ratio, In/(In+Zn), of being 0.84. A mixed gas of argon and oxygen (argon/oxygen=1000/5.0 by volume) was introduced into the vacuum chamber to be at $3 \times 10^{-1}$ Pa. Under this condition, the sintered body was sputtered onto the substrate at a sputtering output of 20 W and at room temperature for the substrate to thereby form an amorphous transparent conductive film having a thickness of 200 nm on the substrate. The amorphous structure of the In—Zn—O oxide film formed herein was confirmed by separately forming the same laminate as above on a nude glass substrate not coated with the thin ITO film, followed by analyzing it through X-ray diffractometry.

Evaluation of Organic EL Device

The sheet resistivity of the amorphous transparent conductive film formed herein was measured in the same manner as in Example 1 to be 16 Ω/square. Since the film had a thickness of 200 nm, its specific resistance was confirmed to be $3.2 \times 10^{-4}$ Ω·cm, which verified the low resistance of the film.

Next, a voltage of 8 V was applied to the device sample with the thin ITO film acting as a positive electrode and the amorphous transparent conductive film acting as a negative electrode, and a current density was measured to be 3.0 mA/cm². The light emission from the device sample was measured at the side of the amorphous transparent conductive film to be 80 cd/m². The color of the light from the Alq emitting layer was green.

After having been kept in air having a relative humidity of 70% RH for 100 hours, this device sample still kept its original light-emitting capacity without having any non-emissive points visible to the naked eye, and its luminous efficiency was not lowered.

EXAMPLE 3
Production of Organic EL Device

The same ITO-covered glass substrate as that used in Example 1 was mounted onto the substrate holder of the same vacuum vapor deposition system as in Example 1, which was degassed to a vacuum degree of b $5 \times 10^{-4}$ Pa. Installed in the system were electrically-heating boats, each of which was loaded with CuPc, TPD and Alq of 200 mg each, and an electrically-heating boat with Mg metal.

CuPc was first deposited on the ITO-covered glass substrate at a thickness of 25 nm, then TPD was at a thickness of 40 nm, and finally Alq was at a thickness of 60 nm. Next, the thus-formed laminate was partly masked, and an electron-injecting metal, magnesium (Mg), and an electron-transporting compound, Alq, were deposited thereon both at once, at a deposition rate of 1.5 nm/sec and 0.1 nm/sec, respectively, to form a mixed electron injection electrode layer having a thickness of 10 nm.

Next, the substrate was transferred to a different vacuum chamber as connected with the system, and mounted onto its substrate holder, while the vacuum degree in the chamber was still kept as above. The vacuum chamber was so designed that an In—Zn—O oxide film could be formed through DC magnetron sputtering, in which the target for forming the In—Zn—O oxide film was a sintered body comprised of $In_2O_3$ and ZnO in an atomic ratio, In/(In+Zn), of being 0.84. A mixed gas of argon and oxygen (argon/oxygen=1000/5.0 by volume) was introduced into the vacuum chamber to be at $3 \times 10^{-1}$ Pa. Under this condition, the sintered body was sputtered onto the substrate at a sputtering output of 1 W/cm² and at room temperature for the substrate to thereby form an amorphous transparent conductive film having a thickness of 200 nm on the substrate. The amorphous structure of the In—Zn—O oxide film formed herein was confirmed by separately forming the same laminate as above on a nude glass substrate not coated with the thin ITO film, followed by analyzing it through X-ray diffractometry.

Evaluation of Organic EL Device

The sheet resistivity of the amorphous transparent conductive film formed herein was measured in the same manner as in Example 1 to be 20 Ω/square. Since the film had a thickness of 200 nm, its specific resistance was confirmed to be $4.0 \times 10^{-4}$ Ω·cm, which verified the low resistance of the film.

Next, a voltage of 8 V was applied to the device sample with the thin ITO film acting as a positive electrode and the amorphous transparent conductive film acting as a negative electrode, which produced a current density of 2.9 mA/cm². The light emission by the device sample was measured at the side of the amorphous transparent conductive film to be 60 cd/m². The color of the light from the Alq emitting layer was green.

After having been kept in air having a relative humidity of 70% RH for 100 hours, this device sample still kept its original light-emitting capacity without having any non-emissive points visible to the naked eye, and its luminous efficiency was not lowered.

EXAMPLE 4
Production of Organic EL Device

The same ITO-covered glass substrate as that used in Example 1 was mounted onto the substrate holder of the same vacuum vapor deposition system as in Example 1, which was degassed to a vacuum degree of $5 \times 10^{-4}$ Pa. Installed in the system were electrically-heating boats, each of which was loaded with CuPc, TPD and Alq of 200 mg each, and electrically-heating filaments with aluminium-lithium alloy (Li content: 2% by weight).

CuPc was first deposited on the ITO-covered glass substrate at a thickness of 25 nm, then TPD was at a thickness of 40 nm, and finally Alq was at a thickness of 60 nm. Next, the thus-formed laminate was partly masked, and the aluminium-lithium alloy was deposited thereon to form an electron injection electrode layer having a thickness of 2 nm. In this, however, the alloy film was island-like discontinuously deposited to form the electron injection electrode layer.

Next, the substrate was transferred to a different vacuum chamber as connected with the system, and mounted onto its substrate holder, while the vacuum degree in the chamber was still kept as above. The vacuum chamber was so designed that an In—Zn—O oxide film could be formed through DC magnetron sputtering, in which the target for forming the In—Zn—O oxide film was a sintered body comprised of $In_2O_3$ and ZnO in an atomic ratio, In/(In+Zn), of being 0.84. A mixed gas of argon and oxygen (argon/oxygen=1000/5.0 by volume) was introduced into the vacuum chamber to be at $3 \times 10^{-1}$ Pa. Under this condition, the sintered body was sputtered onto the substrate at a sputtering output of 1 W/cm² and at room temperature for the substrate to thereby form an amorphous transparent conductive film having a thickness of 200 nm on the substrate. The amorphous structure of the In—Zn—O oxide film formed herein was confirmed by separately forming the same laminate as above on a nude glass substrate not coated with the thin ITO film, followed by analyzing it through X-ray diffractometry.

The island-like structure of the electron injection zone formed herein was confirmed by separately forming the same laminate as above, which, however, was not coated with the amorphous transparent conductive film of In—Zn—O oxide, followed by analyzing it through scanning electronic microscopy.

Evaluation of Organic EL Device

The sheet resistivity of the amorphous transparent conductive film formed herein was measured in the same manner as in Example 1 to be 15 Ω/square. Since the film had a thickness of 200 nm, its specific resistance was confirmed to be $3.0 \times 10^{-4}$ Ω·cm, which verified the low resistance of the film.

Next, a voltage of 8 V was applied to the device sample with the thin ITO film acting as a positive electrode and the amorphous transparent conductive film acting as a negative electrode, which produced a current density of 3.8 mA/cm². The light emission by the device sample was measured at the side of the amorphous transparent conductive film to be 65 cd/m². The color of the light from Alq emitting layer was green.

After having been kept in air having a relative humidity of 70% RH for 100 hours, this device sample still kept its original light-emitting capacity without having any non-emissive points visible to the naked eye, and its luminous efficiency was not lowered.

EXAMPLE 5
Production of Organic EL Device

A member comprised of a 25 mm×75 mm×1 mm glass substrate and a 100 nm thick conductive film of ITO provided on the glass substrate (manufactured by Geomatic) was used as a conductive film-covered substrate. This was dipped in isopropyl alcohol and ultrasonically washed therein, and then cleaned with ultraviolet rays with ozone for 30 minutes using an ultraviolet radiator, UV-300 (manufactured by Samco International).

This ITO-covered glass substrate was mounted onto a substrate holder of a commercially-available vacuum vapor deposition system, which was degassed to a vacuum degree of $5 \times 10^{-4}$ Pa. Installed in the system were electrically-heating boats, each of which was loaded with CuPc, TPD, and Alq of 200 mg each, and electrically-heating filaments with aluminium-lithium alloy (Li content: 2% by weight). These boats and filaments were heated in sequence, whereby the components in those were vaporized and deposited on the ITO-covered glass substrate.

Briefly, CuPc was first deposited on the substrate to form thereon a first hole injection and transportation layer having a thickness of 25 nm, then TPD was to form a second hole injection and transportation layer having a thickness of 40 nm, and finally Alq was to form a light-emitting layer having a thickness of 60 nm. Next, the thus-formed laminate was partly masked, and the aluminium-lithium alloy was deposited thereon to form an electron injection electrode layer having a thickness of 7 nm.

Next, the substrate was transferred to a different vacuum chamber as connected with the system, and mounted onto its substrate holder, while the vacuum degree in the chamber was still kept as above. The vacuum chamber was so designed that an In—Zn—O oxide film could be formed through DC magnetron sputtering, in which the target for forming the In—Zn—O oxide film was a sintered body comprised of $In_2O_3$ and ZnO in an atomic ratio, In/(In+Zn), of being 0.67 . A mixed gas of argon and oxygen (argon/oxygen=1000/2.8 by volume) was introduced into the vacuum chamber to be at $3 \times 10^{-1}$ Pa. Under this condition, the sintered body was sputtered onto the substrate at a sputtering output of 20 W and at room temperature for the substrate to thereby form an amorphous transparent conductive film having a thickness of 100 nm on the substrate. The amorphous structure of the In—Zn—O oxide film formed herein was confirmed by separately forming the same laminate as above on a nude glass substrate not coated with the thin ITO film, followed by analyzing it through X-ray diffractometry.

Next, the sputtering chamber was purged with argon to have a pressure of $3 \times 10^{-1}$ Pa, in which silver (Ag) was sputtered onto the laminated substrate through DC magnetron sputtering at a sputtering output of 10 W and at a room temperature for the substrate to thereby form thereon an Ag layer having a thickness of 5 nm.

Next, an In—Zn—O oxide film having a thickness of 100 nm was formed on the Ag layer of the laminated substrate under the same condition as above, whereby was obtained an organic EL device.

Measurement of Light Transmittance and Sheet Resistivity

In the same manner as above, a laminate comprised of, in sequence, the electron injection electrode layer, the amorphous transparent conductive film, the thin silver film and the In—Zn—O oxide film was directly formed on the same ITO-covered glass substrate as above, and the light transmittance at 460 nm of the laminate was measured, using a spectrophotometer, to be 60%, which verified the high transparency of the laminate.

Also in the same manner as above, another laminate comprised of the amorphous transparent conductive film and the thin silver film was directly formed on the same ITO-covered glass substrate as above, which was then coated with the same In—Zn—O oxide film as above. The sheet resistivity of the surface of this oxide film was measured, using Loresta FP (manufactured by Mitsubishi Petrochemical Co.), to be 10 Ω/square.

Evaluation of Organic EL Device

Next, a voltage of 7 V was applied to the device sample between the thin ITO film acting as a positive electrode and the In—Zn—O oxide film, from which were brought out electrode leads, and a current density was measured to be 2.8 mA/cm$^2$. The light emission by the device sample was measured at the side of the negative electrode to be 60 cd/m$^2$. The color of the light from Alq emitting layer was green.

After having been kept in air having a relative humidity of 70% RH for 100 hours, this device sample still kept its original light-emitting capacity without having any non-emissive points visible to the naked eye.

Comparative Example 2

Production of Organic EL Device

An organic EL device was produced in the same manner as in Example 1. In this, however, a single-layered ITO film having a thickness of 200 nm was formed on the electron injection electrode layer, using a commercially-available ITO target, in place of forming the three-layered laminate comprised of the amorphous transparent conductive film, the thin silver film and the In—Zn—O oxide film. The atmosphere, the atmospheric pressure, the sputtering method and the sputtering output for the formation of that ITO film were the same as those in Example 5.

Measurement of Light Transmittance and Sheet Resistivity

In the same manner as above, a laminate comprised of the electron injection electrode layer and the ITO film was directly formed on the ITO-covered glass substrate, and its light transmittance was measured, in the same manner as in Example 5, to be 80%.

Also in the same manner as above, the ITO film was directly formed on the glass substrate, and the sheet resistance of its surface was measured, in the same manner as in Example 5, to be 130 Ω/square.

Evaluation of Organic EL Device

Next, a voltage of 8 V was applied to the device sample, and a current density was measured to be 4 mA/cm$^2$. The light emission by the device sample was measured at the side of the crystalline transparent conductive film to be 60 cd/m$^2$. The color of the light from the Alq emitting layer was green. After having been kept in an atmosphere having a relative humidity of 70% RH for 100 hours, this device was found to have numerous non-emissive points visible to the naked eye, and was found to have many emission defects.

Those test data verify the superiority of the organic EL device of Example 5 in that its luminous efficiency is high since its negative electrode has high transparency and low resistance, and that it has good durability with producing few emission defects since its outermost layer and its thin In—Zn—O film constituting the layer adjacent to the electron injection electrode layer are amorphous ones. It is known that the oxidation of an electron injection electrode layer inorganic EL device produces emission defects. In the organic EL device of the invention, however, since amorphous transparent conductive films are formed as the outermost layer and as the layer adjacent to the electron injection electrode layer, and since those transparent conductive films have no grain boundaries, it is believed that oxygen and water are prevented from penetrating into the electron injection electrode layer, thereby producing the results as above.

As opposed to this, it is known that the organic EL device of Comparative Example 2 has poor luminous efficiency since its negative electrode has high resistance, though having high transparency.

EXAMPLE 6

Production of Organic EL Device

An organic EL device was produced in the same manner as in Example 5, except that a thin ITO film having a thickness of 100 nm was finally formed through DC magnetron sputtering in place of the finally-formed, thin In—Zn—O oxide film.

Briefly, the thin ITO film was formed herein, using an ITO target, as follows: A mixed gas of argon and oxygen (argon/oxygen=1000/2.8 by volume) was introduced into the sputtering chamber to be at $3 \times 10^{-1}$ Pa, and the ITO target was sputtered therein at a sputtering output of 20 W and at room temperature for the substrate to form on the substrate the intended thin ITO film having a thickness of 100 nm.

Measurement of Light Transmittance and Sheet Resistivity

In the same manner as above, a laminate comprised of, in sequence, the electron injection electrode layer, the amorphous transparent conductive film, the thin silver film and the ITO film was directly formed on the same ITO-covered glass substrate as above, and the light transmittance at 460 nm of the laminate was measured to be 80%, which verified the high transparency of the laminate.

Also in the same manner as above, another laminate comprised of the amorphous transparent conductive film and the thin silver film was directly formed on the same ITO-covered glass substrate as above, which was then coated with the same ITO film as above. The sheet resistivity of the surface of this ITO film was measured, in the same manner as in Example 5, to be 5 Ω/square.

Evaluation of Organic EL Device

Next, a voltage of 6 V was applied to the device sample between the thin ITO film that had been directly laminated on the glass substrate to act as a positive electrode, and the finally-laminated ITO film, from which were brought out electrode leads, and a current density was measured to be 2.5 mA/cm². The light emission by the device sample was measured at the side of the negative electrode to be 60 cd/m². The color of the light from the Alq emitting layer was green.

After having been kept in air having a relative humidity of 70% RH for 100 hours, this device sample still kept its original light-emitting capacity without having any non-emissive points visible to the naked eye.

EXAMPLE 7

Production of Organic EL Device

An organic EL device was produced in the same manner as in Example 5, except that the thickness of the first-formed In—Zn—O oxide film was 200 nm and that a thin film having a thickness of 100 nm was finally formed through RF magnetron sputtering using $TiO_2$ in place of the finally-formed, thin In—Zn—O oxide film.

Briefly, the thin $TiO_2$ film was formed as follows: Argon gas was introduced into the sputtering chamber to be at $3\times10^{-1}$ Pa, and the $TiO_2$ target was sputtered therein at a sputtering output of 20 W and at room temperature for the substrate to form on the substrate the intended thin film having a thickness of 100 nm.

Measurement of Light Transmittance and Sheet Resistivity

In the same manner as above, a laminate comprised of, in sequence, the electron injection electrode layer, the amorphous transparent conductive film, the thin silver film and the thin $TiO_2$ film was directly formed on the same ITO-covered glass substrate as above, and the light transmittance at 460 nm of the laminate was measured to be 85%, which verified the high transparency of the laminate.

Also in the same manner as above, another laminate comprised of the amorphous transparent conductive film and the thin silver film was directly formed on the glass substrate. The sheet resistivity of the surface of the thin silver film was measured, in the same manner as in Example 5, to be 10 Ω/square.

Evaluation of Organic EL Device

Next, a voltage of 7 V was applied to the device sample between the thin ITO film acting as a positive electrode, and the thin silver film, from which were brought out electrode leads, and a current density was measured to be 3.0 mA/cm². The light emission by the device sample was measured at the side of the negative electrode to be 80 cd/m². The color of the light from Alq emitting layer was green.

After having been kept in air having a relative humidity of 70% RH for 100 hours, this device sample still kept its original light-emitting capacity without having any non-emissive points visible to the naked eye.

Those test data verify that the organic EL devices of Examples 6 and 7 have high luminous efficiency since their negative electrode has high transparency and low resistance, and that they have good durability with producing few emission defects since, in these, the thin In—Zn—O film constituting the layer adjacent to the electron injection electrode layer is amorphous.

As has been mentioned hereinabove in detail, the organic EL device of embodiments (1) to (5) of the invention has a negative electrode with low resistance and high transparency, and therefore the light emission can be taken out efficiently through its both sides. In addition, the organic EL device has good durability since water and oxygen hardly penetrate thereinto through the transparent conductive film constituting the negative electrode. Accordingly, the organic EL device of those embodiments of the invention is favorably used in, for example, information display devices.

The organic EL device of embodiments (6) to (13) of the invention also has a negative electrode with low resistance and high transparency, and therefore the light emission can be taken out efficiently through its both sides. In addition, when this is used in high-resolution display devices, the luminance of the light to be emitted by it fluctuate little and its response is delayed little. Moreover, since the negative electrode of the device can be taper-like etched, it is easy to produce high-resolution display devices using it. Furthermore, since the organic EL device of those embodiments of the invention has good durability (wet heat resistance), it is favorably used in, for example, information display devices.

While the invention has been described in detail and with reference to specific embodiments thereof, it will be apparent to one skilled in the art that various changes and modifications can be made therein without departing from the spirit and scope thereof.

What is claimed is:

1. An organic electroluminescent device comprising a positive electrode, a light transmissive negative electrode and an organic layer including an organic light-emitting layer sandwiched between the two electrodes, wherein the negative electrode comprises an electron injection electrode layer and an amorphous transparent conductive film, and wherein the electron injection electrode layer is adjacent to the organic layer.

2. The organic electroluminescent device as claimed in claim 1, wherein the electron injection electrode layer is of an ultra-thin film comprising one or more materials selected from the group consisting of electron-injecting metals, alloys and alkaline earth metal oxides.

3. The organic electroluminescent device as claimed in claim 1, wherein the electron injection electrode layer is a layer comprising a mixture of (1) one or more materials selected from the group consisting of electron-injecting metals, alloys and alkaline earth metal oxides, and (2) an electron-transporting organic substance.

4. The organic electroluminescent device as claimed in claim 1, wherein the electron injection electrode layer comprises an island-like electron injection zone.

5. The organic electroluminescent device as claimed in any one of claims 1 to 4, wherein the amorphous transparent conductive film comprises an indium(In)-zinc(Zn)-oxygen (O) oxide.

6. An organic electroluminescent device comprising a positive electrode, a light transmissive negative electrode and an organic layer including an organic light-emitting layer sandwiched between the two electrodes, wherein the negative electrode comprises, in the following order, an electron injection electrode layer, a transparent conductive film, and a thin metal film having a specific resistance of not larger than $1\times10^{-5}$ Ω·cm and a light transmittance of between 70 and 90%, and wherein the electron injection electrode layer is adjacent to the organic layer, and wherein a thin transparent film is formed on the thin metal film of the negative electrode.

7. The organic electroluminescent device as claimed in claim 6, wherein the transparent conductive film is an amorphous transparent conductive film.

8. The organic electroluminescent device as claimed in claim 7, wherein the amorphous transparent conductive film comprises an indium(In)-zinc(Zn)-oxygen(O) oxide.

9. The organic electroluminescent device as claimed in any one of claims 6 to 8, wherein the electron injection electrode layer is of an ultra-thin film comprising one or more materials selected from the group consisting of electron-injecting metals, alloys and alkaline earth metal oxides.

10. The organic electroluminescent device as claimed in any one of claims 6 to 8, wherein the electron injection electrode layer is a layer comprising a mixture of (1) one or more materials selected from the group consisting of electron-injecting metals, alloys and alkaline earth metal oxides, and (2) an electron-transporting organic substance.

11. The organic electroluminescent device as claimed in any one of claims 6 to 8, wherein the electron injection electrode layer comprises an island-like electron injection zone.

12. The organic electroluminescent device as claimed in claim 7 or 8, wherein the negative electrode and the positive electrode form a XY matrix and the transparent conductive film is formed to have a trapezoidal (tapered) cross-sectional profile.

13. An organic electroluminescent device comprising a positive electrode, a negative electrode and an organic layer including an organic light-emitting layer sandwiched between the two electrodes, wherein a thin transparent film is formed on an outer surface of the negative electrode thereby forming a layer comprising the negative electrode and the thin transparent film, wherein said layer has a light transmittance of not smaller than 60% and a sheet resistivity of not larger than 10 $\Omega$/square.

\* \* \* \* \*